United States Patent
Chen et al.

(10) Patent No.: US 12,341,608 B2
(45) Date of Patent: Jun. 24, 2025

(54) METHOD FOR LINK TRANSITION IN UNIVERSAL SERIAL BUS AND SYSTEM THEREOF

(71) Applicant: MEDIATEK INC., Hsin-Chu (TW)

(72) Inventors: Yu-Cheng Chen, Hsinchu (TW); Chih-Chieh Wang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/501,053

(22) Filed: Nov. 3, 2023

(65) Prior Publication Data
US 2025/0150202 A1     May 8, 2025

(51) Int. Cl.
H04L 1/00     (2006.01)

(52) U.S. Cl.
CPC .......... *H04L 1/0057* (2013.01); *H04L 1/0041* (2013.01)

(58) Field of Classification Search
CPC ......... H04L 1/004; H04L 1/08; H04L 1/0041; H04L 1/0057; H03M 13/03; H03M 13/05; H03M 13/17; H03M 13/1515
See application file for complete search history.

(56) References Cited

U.S. PATENT DOCUMENTS

| | | |
|---|---|---|
| 6,697,368 B2 | 2/2004 | Chang |
| 2019/0305888 A1 | 10/2019 | Das Sharma |
| 2020/0153548 A1* | 5/2020 | Lusted .................. H03M 13/353 |
| 2021/0367900 A1* | 11/2021 | Das Sharma ............. H04L 1/08 |
| 2023/0023258 A1 | 1/2023 | Laursen |
| 2023/0129113 A1 | 4/2023 | Dai |
| 2023/0281151 A1* | 9/2023 | Fujita ................... H04B 10/075 |

FOREIGN PATENT DOCUMENTS

| | | |
|---|---|---|
| EP | 4 177 711 A1 | 5/2023 |
| WO | 2019/139592 A1 | 7/2019 |

OTHER PUBLICATIONS

Universal Serial Bus interfaces for data and power—Part 4-1: Universal Serial Bus 4 (TM) Specification, IEC 62680-4-1, Edition 1.0, Oct. 2022, IEC, Switzerland, XP082052410 ,Oct. 2022.

* cited by examiner

*Primary Examiner* — Shelly A Chase
(74) *Attorney, Agent, or Firm* — Winston Hsu

(57) ABSTRACT

A method for link transition in a USB device includes transmitting a plurality of first RS-FEC blocks by a first transmitter, receiving an UNBOND set by a receiver, waking up a second transmitter by a LASM when the receiver receives the UNBOND set, transmitting a training sequence by the second transmitter, transmitting a specific pattern sequence by the second transmitter after finishing transmitting the training sequence, determining whether a current RS-FEC block to be transmitted by the first transmitter is a DESKEW block, stopping transmitting the specific pattern sequence if the current RS-FEC block is determined to be the DESKEW block, and transmitting a plurality of second RS-FEC blocks by the first transmitter and the second transmitter.

20 Claims, 6 Drawing Sheets

METHOD FOR LINK TRANSITION IN UNIVERSAL SERIAL BUS AND SYSTEM THEREOF

BACKGROUND

Universal Serial Bus (USB) is an industry standard that specifies the physical interfaces and protocols for connecting, data transferring and powering of hosts, such as personal computers, peripherals, e.g., keyboards and mobile devices, and intermediate hubs. USB was designed to standardize the connection of peripherals to computers, replacing various interfaces such as serial ports, parallel ports, game ports, and ADB (Android Debug Bridge) ports. It has become a general standard for a wide range of devices, such as keyboards, mice, cameras, printers, scanners, flash drives, smartphones, game consoles, and power banks. As of 2023, USB consists of four generations of specifications: USB 1.x, USB 2.0, USB 3.x, and USB4.

USB4 (sometimes referred to as USB 4.0) is a new generation of the Universal Serial Bus (USB) standard released in 2019 by the USB Implementers Forum (USB-IF). It is based on the Thunderbolt 3 protocol specification yet also supports multiple data and display protocols, such as DisplayPort and PCI Express (PCIe). The USB4 architecture can share a single, high-speed link with multiple hardware endpoints dynamically, best serving each transfer by data type and application. The USB4 contains enhanced data transfer and power supply functionality with connection-oriented, tunneling architecture designed to combine multiple protocols onto a single physical interface, so that the total speed and performance of the USB4 Fabric can be dynamically shared.

Key characteristics of USB4 include two-lane operation using existing USB Type-C cables and up to 80 Gbps operation over 80 Gbps certified cables, multiple data and display protocols to efficiently share the maximum aggregate bandwidth over the bus, and backwards compatibility with all previous versions of USB.

USB4 by itself does not provide any generic data transfer mechanism or device classes like USB 3.x, but serves mostly as a way to tunnel other protocols such as USB 3.2, DisplayPort, and optionally PCIe. With the USB4 1.0 specification, when the host and device do not support optional PCIe tunneling, the non-display bandwidth is limited to mandatory 10 Gbit/s described by USB 3.2, but including optional support for 20 Gbit/s. The USB4 2.0 specification introduced optional support for a new USB3 Gen T tunneling that extends the USB3 protocol to be able to use the maximum available bandwidth. USB4 2.0 specifies tunneling of USB 3.2 ("Enhanced SuperSpeed") Tunneling, DisplayPort 2.1-based Tunneling, and PCIe-based Tunneling.

The USB4 specification describes that a USB4 Port shall follow certain steps when transitioning to a symmetric link. The key steps are:
- The new transmitter shall transmit back-to-back DESKEW.0 ordered sets or data sets and wait for the existing transmitter (Tx0) to add it to the Link; and
- When Tx1 is transmitting DESKEW.0 ordered sets or data sets, upon an RS-FEC block start (either the first RS-FEC block start or upon any subsequent RS-FEC block start while Tx1 is transmitting DESKEW.0 ordered set or data sets), the USB4 Port shall transmit a De-skew Block on the two transmitters (Tx0 and Tx1).

However, the specification lacks the details of how the designer can implement these steps. Thus, it is necessary to come out with an implementation for transitioning to a symmetric link.

SUMMARY

An embodiment provides a method for link transition in a Universal Serial Bus (USB) device including transmitting a plurality of first RS-FEC blocks by a first transmitter, receiving an UNBOND set by a receiver, waking up a second transmitter by a lane adapter state machine (LASM) when the receiver receives the UNBOND set, transmitting a training sequence by the second transmitter, transmitting a specific pattern sequence by the second transmitter after finishing transmitting the training sequence, determining whether a current RS-FEC block to be transmitted by the first transmitter is a DESKEW block, stopping transmitting the specific pattern sequence if the current RS-FEC block is determined to be the DESKEW block, and transmitting a plurality of second RS-FEC blocks by the first transmitter and the second transmitter.

An embodiment provides a Universal Serial Bus (USB) device including a receiver, a first transmitter, a second transmitter and a controller coupled to the receiver, the first transmitter and the second transmitter. The receiver is used to receive an UNBOND set. The first transmitter is used to transmit a plurality of first RS-FEC blocks and a plurality of second RS-FEC blocks. The second transmitter is used to transmit a training sequence, a specific pattern sequence and the plurality of second RS-FEC blocks. The controller is used to implement a lane adapter state machine (LASM), and wake up the second transmitter by the LASM when the receiver receives the UNBOND set. The first transmitter determines whether a current RS-FEC block to be transmitted by the first transmitter is a DESKEW block.

These and other objectives of the present invention will no doubt become obvious to those of ordinary skill in the art after reading the following detailed description of the preferred embodiment that is illustrated in the various figures and drawings.

DETAILED DESCRIPTION

For terms and techniques not specifically described, reference may be made to wireless communication standard documents (e.g., USB Specifications) issued before this specification.

In this specification, technical features that are individually described within one drawing may be implemented individually or simultaneously.

USB4 is similar to earlier versions of USB in that it is a cable bus supporting data exchange between a host computer and a wide range of simultaneously accessible peripherals. However, USB4 also allows a host computer to setup data exchange between compatible peripherals. The attached peripherals share bandwidth as configured by the host computer. The bus allows peripherals to be attached, configured, used, and detached while the host and other peripherals are in operation.

When configured over a USB Type-C connector interface, USB4 functionally replaces USB 3.2 while retaining USB 2.0 bus operating in parallel. Enhanced SuperSpeed USB, as defined in the USB 3.2 Specification, remains the fundamental architecture for USB data transfer on a USB4 Fabric. The difference with USB4 versus USB 3.2 is that USB4 is a connection-oriented, tunneling architecture designed to combine multiple protocols onto a single physical interface, so that the total speed and performance of the USB4 Fabric can be dynamically shared. USB4 allows for USB data transfers to operate in parallel with other independent protocols specific to display, load/store and host-to-host interfaces. Additionally, USB4 extends performance beyond the 20 Gbps (Gen 2×2) of USB 3.2 to 80 Gbps (Gen 4×2) over the same dual-lane, dual-simplex architecture.

Figure 1:
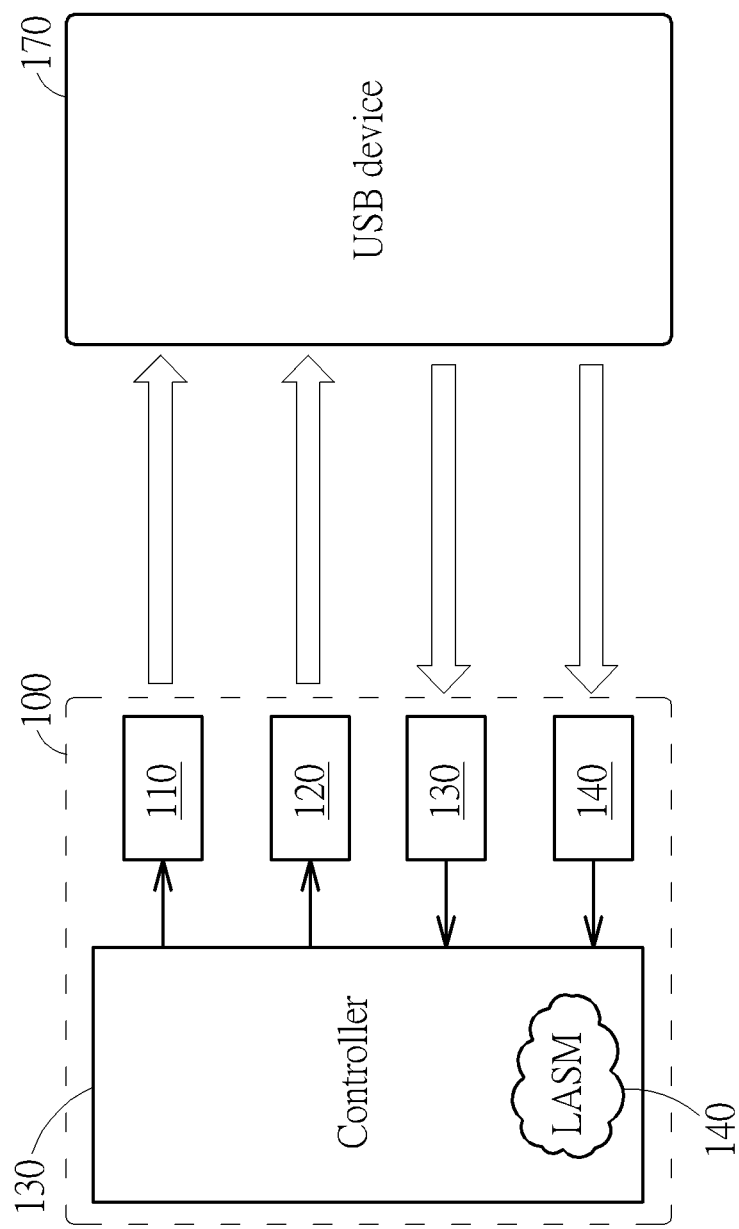
FIG. 1 illustrates a USB system of an embodiment of the present invention.

FIG. 1 illustrates a USB system 100 of an embodiment. The USB system 100 has a controller 150 coupled with four links. For illustration purpose, two links may be configured as transmitters 110 and 120, and two other links may be configured as receivers 130 and 140. The first transmitter 110 is used to transmit a plurality of first RS-FEC blocks to a USB device 150. The second transmitter 120 is used to transmit a training sequence and a specific pattern sequence to the USB device 150. The controller 130 is used to determine the number of sets in a first RS-FEC block which have been transmitted by the first transmitter when the second transmitter completes transmitting the training sequence, and generate the specific pattern sequence according to the number of sets in the first RS-FEC block which have been transmitted by the first transmitter and a total number of sets in the first RS-FEC block. The controller 130 can implement a lane adapter state machine (LASM) 140 to determine the current state (e.g., CL0 state) of the transmitters 110 and 120.

However, the number of transmitters and receivers is not limited thereto. One of the transmitters 110 or 120 can be configured as a receiver, such that the USB system 100 would have three receivers and one transmitter. On the other hand, one of the receivers 130 or 140 can be configured as a transmitter, such that the USB system 100 would have three transmitters and one receiver. Thus, according to the USB4 specification, with total of 4 links, the number of transmitters can be 1, 2 or 3; the number of receivers can also be 1, 2 or 3.

In some embodiments, the first transmitter 110 and the second transmitter 120 may each include an OS (Ordered Sets) generator and a TS (Training Sequence) generator. The OS generator can generate the first RS-FEC blocks and the second RS-FEC blocks, and the TS generator can generate the training sequence.

The USB4 specification specifies that the Logical Layer employs a Reed-Solomon forward error-correction code (RS-FEC), and an adapter shall support RS-FEC at all speeds. RS-FEC blocks are a type of error correction code blocks that can improve the reliability and performance of USB data transmission. It works by adding extra bits to the data stream that can be used to detect and correct errors. RS-FEC blocks are implemented in the USB 3.2 and USB 4.0 standards, and they can reduce the bit error rate and increase the effective throughput of USB systems. RS-FEC blocks are especially useful for high-speed and long-distance USB connections, where noise and interference can cause data corruption.

USB link training is a process that occurs when a USB device is first connected to a USB host. The purpose of link training is to establish a high-speed connection between the device and the host. It can involve a series of steps, including device discovery, link negotiation and link training. Device discovery is a process which the host and device exchange information to identify each other. Link negotiation is a process which the host and device agree on the highest possible link speed that they can both support. Link training is a process which the host and device exchange data to ensure that they are able to communicate at the agreed-upon link speed.

In the USB4 specification, a training sequence for link training is implemented to establish communication between a transmitter and a receiver, and more particularly, to negotiate the link parameters (e.g., the optimal link speed, lane count and encoding scheme) and establish a connection. The training sequence is sent by the transmitter and is used by the receiver to determine the channel characteristics and adjust its parameters accordingly. The training sequence is typically a known pattern that is repeated several times during the link training process.

The Lane Adapter State Machine (LASM) is used in the context of USB4 link initialization. It describes the behavior of the logical link layer during the linkup sequence. The sequence includes the following steps: Link partners connect initially during CLd state entry (lane initialization), followed by lane configuration, link training, and finally, link-up.

Figure 2:
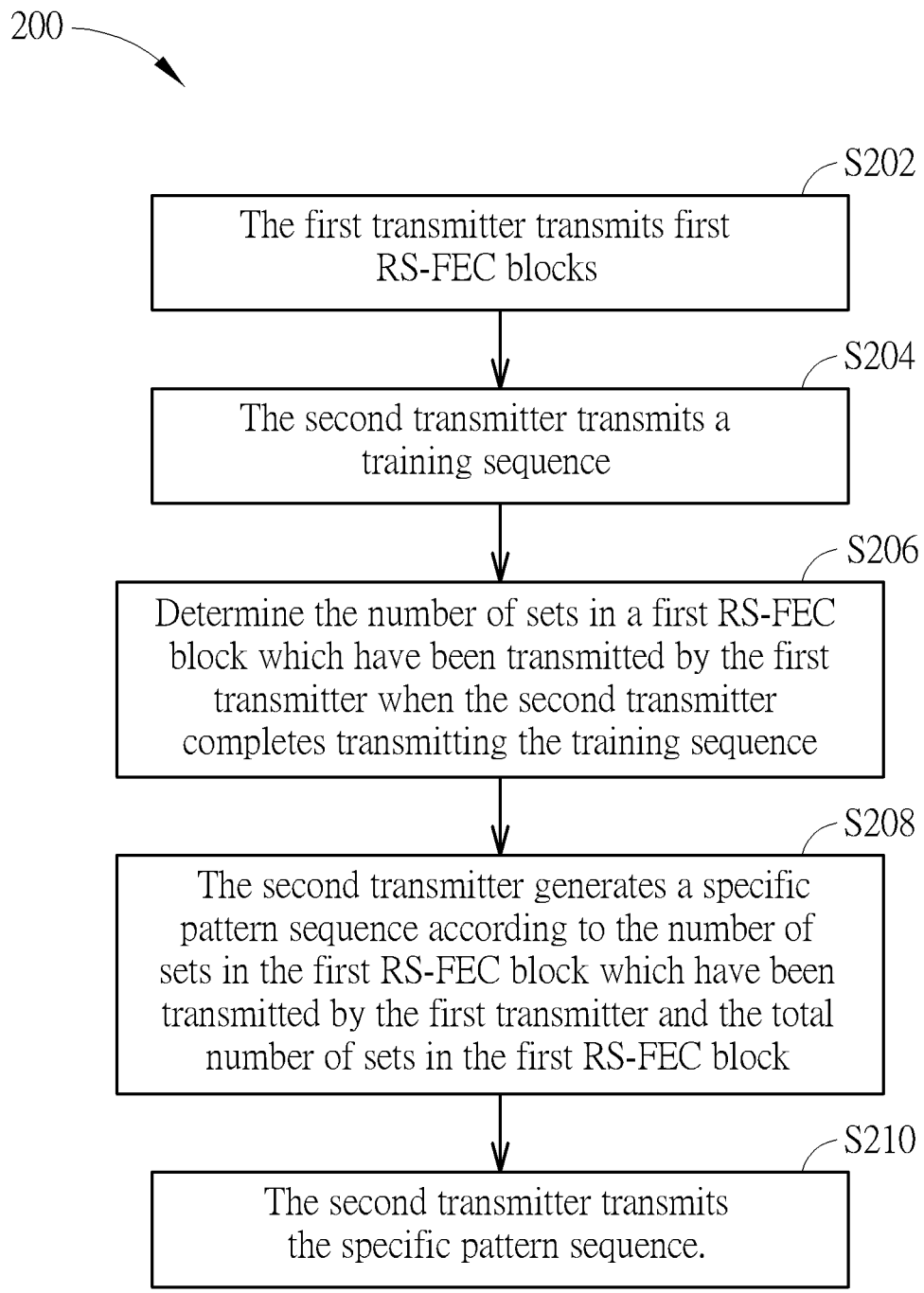
FIG. 2 illustrates a flowchart of a method for link transition implemented by the USB system of FIG. 1.

FIG. 2 illustrates a flowchart of a method 200 for link transition implemented by the USB system 100. The method 200 applies particularly to scenario when the number of transmitter increases, i.e., a scenario where a receiver has been switched to the second transmitter 120. The method 200 includes the following steps:

S202: The first transmitter 110 transmits first RS-FEC blocks;

S204: The second transmitter 120 transmits a training sequence;

S206: Determine the number of sets in a first RS-FEC block which have been transmitted by the first transmitter 110 when the second transmitter 120 completes transmitting the training sequence;

S208: The second transmitter 120 generates a specific pattern sequence according to the number of sets in the first RS-FEC block which have been transmitted by the first transmitter 110 and the total number of sets in the first RS-FEC block; and S210: The second transmitter 120 transmits the specific pattern sequence.

Figure 3:
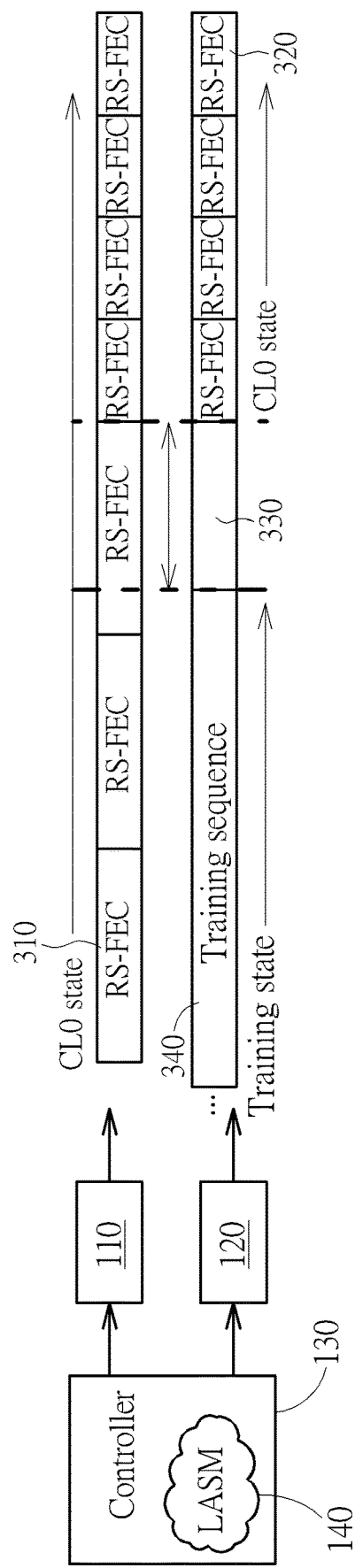
FIG. 3 illustrates an embodiment where the USB system of FIG. 1 transitioning from one transmitter to two transmitters.

The detail implementation of the method 200 is described by FIG. 3 and the following associated paragraphs.

In some embodiments, the controller 130 can be used to determine the number of sets in a first RS-FEC block which have been transmitted by the first transmitter 110 when the second transmitter 120 completes transmitting the training sequence.

In some embodiments, the specific pattern sequence filling the blanking period may be DESKEW.0 ordered sets as specified in the USB4 specification.

Please refer to both FIG. 1 and FIG. 3. FIG. 3 illustrates an embodiment where the USB system 100 transitioning from one transmitter to two transmitters. The first transmitter 110 is in CL0 (Committed Link 0) state and the second transmitter 120 is in the training state while transmitting the first RS-FEC blocks 310 to the USB device 150. When the LASM 140 in the controller 130 wakes up the second transmitter 120 from idling, the second transmitter 120 would begin to transmit the training sequence 340 to the USB device 150. When the second transmitter 120 and the USB device 150 are synchronized, a link is established.

However, the second transmitter 120 must transmit RS-FEC blocks synchronously with the first transmitter 110 according to the USB4 specification. Thus, the second transmitter 120 may need to wait until the first transmitter 110 finishes transmitting the current first RS-FEC blocks 310. While the second transmitter 120 is waiting, it can transmit the specific pattern sequence 330 (e.g., DESKEW.0 ordered sets) to fill in the blanking period. The number of sets in the specific pattern sequence 330 can be determined by subtracting the number of sets in the first RS-FEC block 310 which have been transmitted by the first transmitter 110 from the total number of sets in the first RS-FEC block 310.

For example, each first RS-FEC block 310 may be defined to include 126 sets. When the second transmitter 120 starts to transmit the specific pattern sequence 330, the first transmitter 110 may be currently transmitting the 31st set in a first RS-FEC block 310. Then, the controller 130 can determine that the second transmitter 120 needs to transmit 95 (=126−31) sets of the specific pattern sequence 330 to fill in the blanking period. At the end of transmission of the specific pattern sequence 330, the second transmitter 120 enters the CL0 state (i.e., activated), and the first transmitter 110 and the second transmitter 120 would transmit the second RS-FEC blocks 320 synchronously. That is, the second RS-FEC blocks 320 transmitted by the first transmitter 110 must align with the second RS-FEC blocks 320 transmitted by the second transmitter 120. Thus, the link transition is complete.

It should be noted that each second RS-FEC block 320 includes half the number of sets in each first RS-FEC block 310. In other words, each second RS-FEC block 320 includes 63 (=126/2) sets when two transmitters transmit data simultaneously. Accordingly, the first RS-FEC block 310 and the second RS-FEC block 320 contain substantially the same amount of data. Since these data are now transmitted by two transmitters (i.e., transmitters 110 and 120), the transmission speed may be doubled to reduce transmission time.

In some embodiments, a third transmitter may be introduced. The same method may be applied to activate the third transmitter. In this scenario, a third RS-FEC block would include 42 (=126/3) sets when three transmitters transmit data simultaneously. The transmission speed may triple as compare to that of a single active transmitter.

Figure 4:
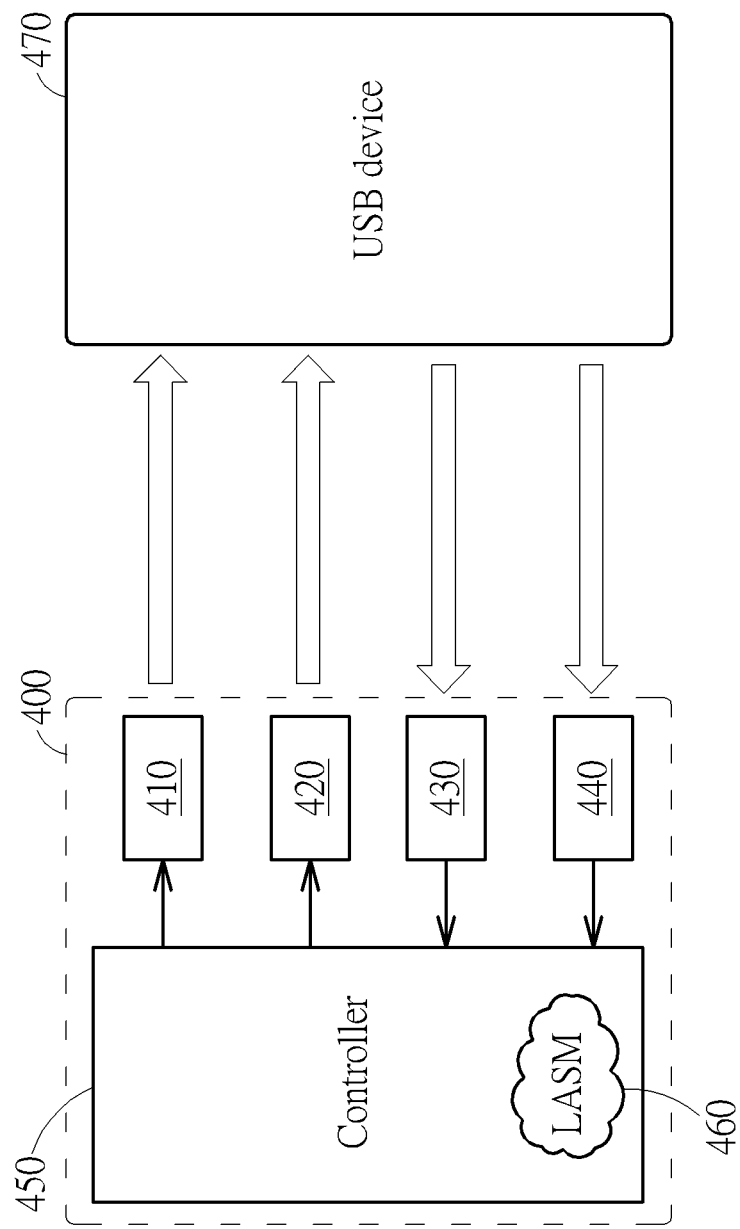
FIG. 4 illustrates a USB system of another embodiment of the present invention.

FIG. 4 illustrates a USB system 400 of another embodiment. The USB system 400 has a controller 450 coupled with four links. For illustration purpose, two links can be configured as transmitters 410 and 420, and two other links can be configured as receivers 430 and 440. The receiver 430 and 440 can each receive an UNBOND set from a USB device 470. The first transmitter 410 is used to transmit a plurality of first RS-FEC blocks and a plurality of second RS-FEC blocks to the USB device 470. The second transmitter 420 is used to transmit a training sequence, a specific pattern sequence and the plurality of second RS-FEC blocks to the USB device 470. The controller 450 is used to implement a lane adapter state machine (LASM) 460, and wake up the second transmitter 420 according the LASM 460 when the receiver 430 receives the UNBOND set. The first transmitter 410 can determine whether a current RS-FEC block to be transmitted by the first transmitter 410 is a DESKEW block. The USB device 470 can be considered as a USB device in process to be synchronized with the USB system 400. The training sequence is for synchronizing the second transmitter 420 with a receiver of the USB device 470.

However, the number of transmitters and receivers is not limited thereto. One of the transmitters 410 or 420 can be configured as a receiver, such that the USB system 400 would have three receivers and one transmitter. On the other hand, one of the receivers 430 or 440 can be configured as a transmitter, such that the USB system 100 would have three transmitters and one receiver. Thus, according to the USB4 specification, with total of 4 links, the number of transmitters can be 1, 2 or 3; the number of receivers can also be 1, 2 or 3.

In some embodiments, the first transmitter 410 and the second transmitter 420 each include an OS (Ordered Sets) generator and a TS (Training Sequence) generator. The OS generator is used to generate the plurality of first RS-FEC blocks and the plurality of second RS-FEC blocks, and the TS generator is used to generate the training sequence.

The LASM 460 functions similarly to the LASM 140. The description is not repeated herein.

Figure 5:
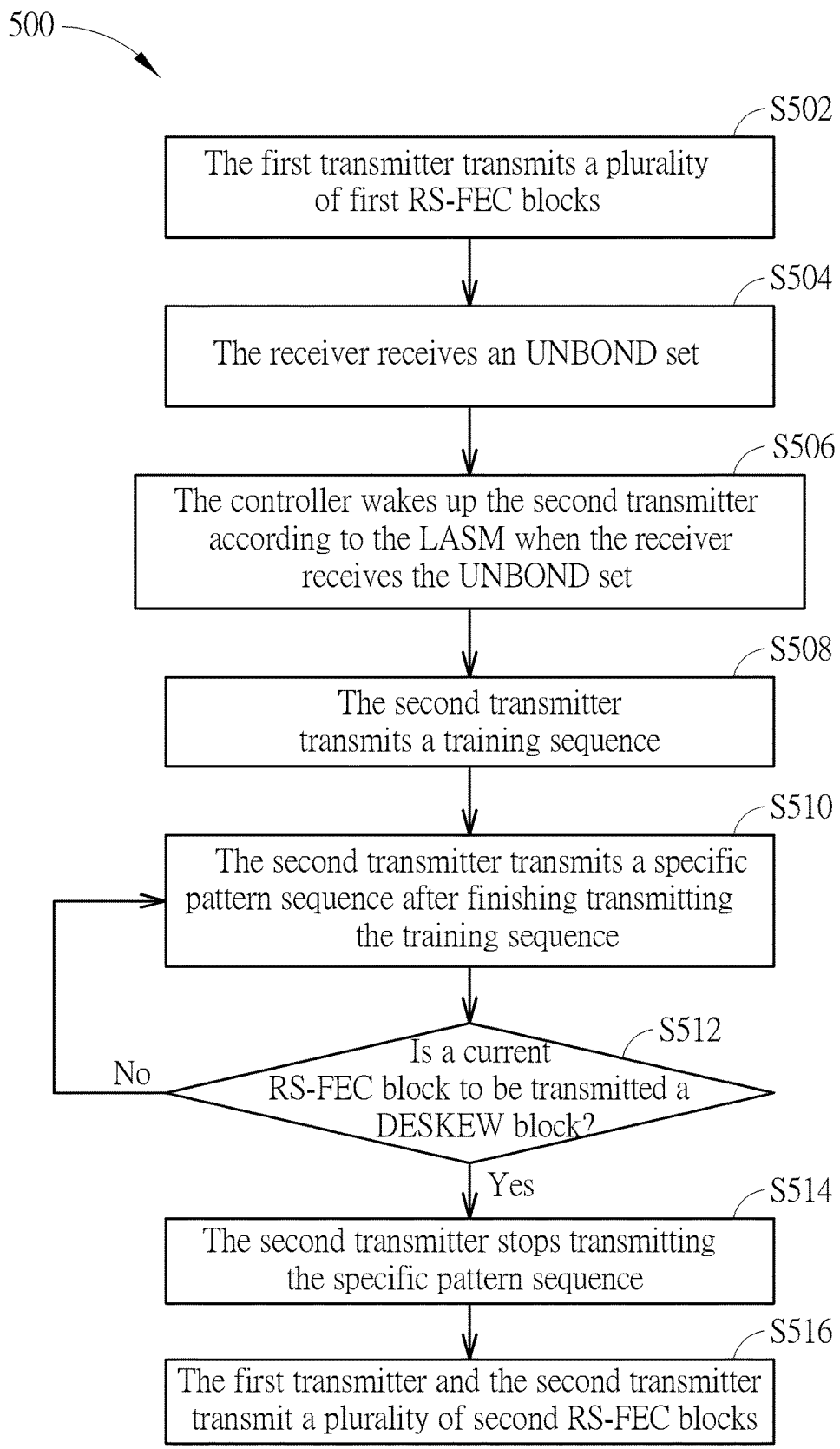
FIG. 5 illustrates a flowchart of a method for link transition implemented by the USB system of FIG. 4.

FIG. 5 illustrates a flowchart of a method 500 for link transition implemented by the USB system 400. The method 500 applies particularly to scenario when the number of transmitter increases, i.e., a scenario where a receiver has been switched to the second transmitter 420. The method 500 includes the following steps:

S502: The first transmitter 410 transmits a plurality of first RS-FEC blocks;

S504: The receiver 430 receives an UNBOND set;

S506: The controller 450 wakes up the second transmitter 420 according to the LASM 460 when the receiver 430 receives the UNBOND set;

S508: The second transmitter 420 transmits a training sequence;

S510: The second transmitter 420 transmits a specific pattern sequence after finishing transmitting the training sequence;

S512: Determine whether a current RS-FEC block to be transmitted by the first transmitter 410 is a DESKEW block; if it is a DESKEW block, proceed to S514; if not, go back to S510;

S514: The second transmitter 420 stops transmitting the specific pattern sequence; and S516: The first transmitter 410 and the second transmitter 420 transmit a plurality of second RS-FEC blocks.

Figure 6:
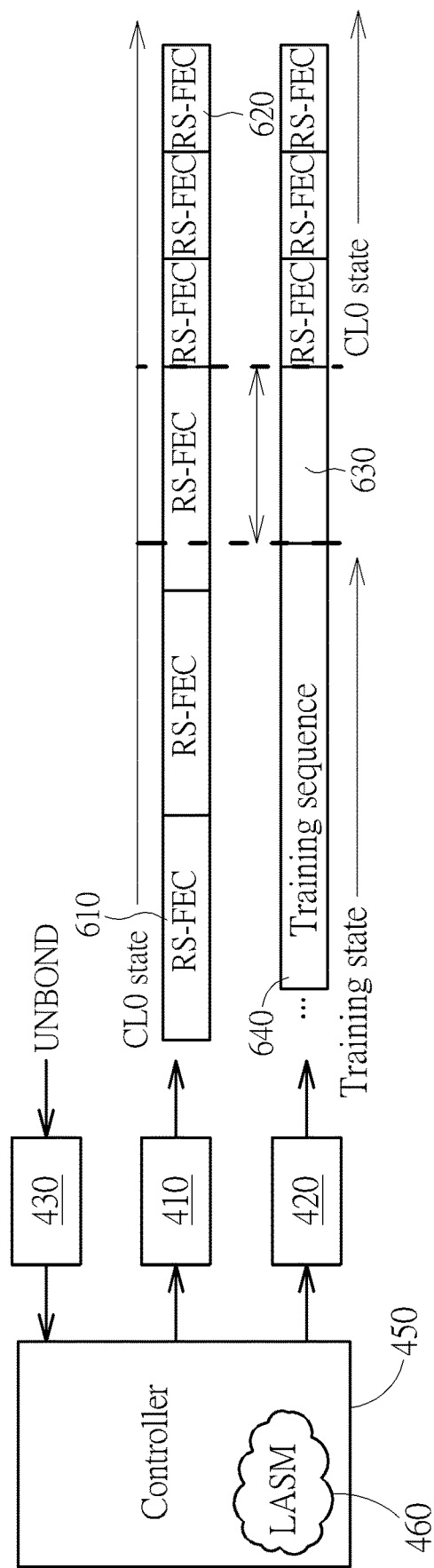
FIG. 6 illustrates an embodiment where the USB system of FIG. 4 transitioning from one transmitter to two transmitters.

The detail implementation of the method 500 is described by FIG. 6 and the following associated paragraphs.

In some embodiments, whether a current RS-FEC block to be transmitted by the first transmitter 410 is a DESKEW block can be determined by the first transmitter 410 according to the boundary of the current RS-FEC block.

Please refer to both FIG. 4 and FIG. 6. FIG. 6 illustrates an embodiment where the USB system 400 transitioning from one transmitter to two transmitters. While the first transmitter 410 is transmitting the first RS-FEC blocks 610 in the CL0 state, the receiver 430 receives the UNBOND set. The UNBOND set is a signal for the LASM 460 to wake up the second transmitter 420. Once the second transmitter 420 wakes up and enters the training state according to the LASM 460, the second transmitter 420 would start to transmit the training sequence 640. When the second transmitter 420 is synchronized with a receiver of the USB device 470, the second transmitter 420 finishes transmitting the training sequence 640 and starts to transmit the specific pattern sequence 630 (e.g., DESKEW.0 ordered sets). At this time, the first transmitter 410 can prepare to transmit the second RS-FEC blocks 620. Also at the same time, the first transmitter 410 can actively monitor and detect for the boundary of the first one of the second RS-FEC blocks 620 (i.e., DESKEW block) transmitted by the first transmitter 610. It should be noted that the DESKEW block is different from the DESKEW.0 ordered sets in the USB4 specification. In the embodiment, DESKEW is the name of the package of first one of the second RS-FEC blocks 620. In contrast, RS-FEC describes the encoding scheme of the blocks in transmission.

When the boundary of the DESKEW block is detected in a queue of the first transmitter 410, the second transmitter 420 would enter the CL0 state and transmit the DESKEW block synchronously with the first transmitter 410. That is, the boundaries of the DESKEW blocks are aligned. In other words, the first transmitter 410 and the second transmitter 420 would transmit the DESKEW blocks and the following second RS-FEC blocks 620 synchronously. Thus, the link transition is complete.

In some embodiments, the first transmitter 410 can use an index number of an RS-FEC block to determine whether the next RS-FEC block to be transmitted is the DESKEW block. However, other methods of determination are also included, and the invention is not limited thereto.

In some embodiments, the first RS-FEC blocks 610 may be defined to include 126 sets when only a single transmitter transmits data. The second RS-FEC blocks 620 may include 63 (=126/2) sets when two transmitters transmit data simultaneously.

In some embodiments, a third transmitter may be introduced. The same method described above may be applied to activate the third transmitter. In this scenario, a third RS-FEC block would include 42 (=126/3) sets when three transmitters transmit data simultaneously. The transmission speed may triple as compared to that of a single active transmitter.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The hardware and data processing apparatus used to implement the various illustrative components, logics, logical blocks, modules and circuits described in connection with the aspects disclosed herein may be implemented or performed with a general purpose single-chip processor or multi-chip processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, for example, a combination of a DSP and a microprocessor, multiple microprocessors, one or more microprocessors in conjunction with a DSP core, or any other such configuration. In some implementations, particular processes, operations and methods may be performed by circuitry that is specific to a given function.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

As described above, in some aspects implementations of the subject matter described in this specification can be implemented as software. For example, various functions of components disclosed herein or various blocks or steps of a method, operation, process or algorithm disclosed herein can be implemented as one or more modules of one or more computer programs. Such computer programs can include non-transitory processor executable or computer executable instructions encoded on one or more tangible processor readable or computer readable storage media for execution by, or to control the operation of, data processing apparatus including the components of the devices described herein. By way of example, and not limitation, such storage media may include RAM, ROM, EEPROM, CD-ROM or other optical disk storage, magnetic disk storage or other magnetic storage devices, or any other medium that may be used to store program code in the form of instructions or data structures. Combinations of the above should also be included within the scope of storage media.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example process in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for link transition in a Universal Serial Bus (USB) device, the method comprising:
    transmitting a plurality of first RS-FEC (Reed Solomon Forward Error Correction) blocks by a first transmitter;
    receiving an activating signal by a receiver;
    activating a second transmitter according to a lane adapter state machine (LASM) when the receiver receives the activating signal;
    transmitting a training sequence by the second transmitter;
    transmitting a specific pattern sequence by the second transmitter after finishing transmitting the training sequence;
    determining whether a current RS-FEC block to be transmitted by the first transmitter is a DESKEW block;
    stopping transmitting the specific pattern sequence if the current RS-FEC block is determined to be the DESKEW block; and
    transmitting a plurality of second RS-FEC blocks by the first transmitter and the second transmitter.

2. The method of claim 1, wherein determining whether the current RS-FEC block to be transmitted by the first transmitter is the DESKEW block is performed by detecting a boundary of the current RS-FEC block.

3. The method of claim 1, wherein the plurality of second RS-FEC blocks are transmitted simultaneously by the first transmitter and the second transmitter.

4. The de-skew method of claim 1, wherein the plurality of first RS-FEC blocks are transmitted while the first transmitter is in a CL0 (Committed Link 0) state, and the plurality of second RS-FEC blocks are transmitted while the first transmitter and the second transmitter are in the CL0 state.

5. The method of claim 1, wherein the training sequence is transmitted while the second transmitter is in a training state.

6. The method of claim 1, wherein a first block in sequence of the plurality of second RS-FEC block is the DESKEW block.

7. The method of claim 1, wherein the second transmitter starts transmitting the training sequence when the second transmitter wakes up from idling.

8. The method of claim 1, wherein the training sequence synchronizes the second transmitter with a receiver of another USB device.

9. The method of claim 1, wherein the first transmitter and the second transmitter each comprise:
    an OS generator configured to generate the plurality of first RS-FEC blocks and the plurality of second RS-FEC blocks; and
    a TS generator configured to generate the training sequence.

10. The method of claim 1, wherein the first transmitter and the second transmitter are directed by the LASM to change states.

11. A Universal Serial Bus (USB) device comprising:
    a receiver configured to receive an activating signal;
    a first transmitter configured to transmit a plurality of first RS-FEC blocks and a plurality of second RS-FEC blocks;
    a second transmitter configured to transmit a training sequence, a specific pattern sequence and the plurality of second RS-FEC blocks; and
    a controller coupled to the receiver, the first transmitter and the second transmitter, and configured to:
        implement a lane adapter state machine (LASM); and
        wake up the second transmitter by the LASM when the receiver receives the activating signal;
    wherein the first transmitter determines whether a current RS-FEC block to be transmitted by the first transmitter is a DESKEW block.

12. The USB device of claim 11, wherein whether the current RS-FEC block to be transmitted by the first transmitter is the DESKEW block determined by detecting a boundary of the current RS-FEC block.

13. The USB device of claim 11, wherein the plurality of second RS-FEC blocks are transmitted simultaneously by the first transmitter and the second transmitter.

14. The USB device of claim 11, wherein the plurality of first RS-FEC blocks are transmitted while the first transmitter is in a CL0 (Committed Link 0) state, and the plurality of second RS-FEC blocks are transmitted while the first transmitter and the second transmitter are in the CL0 state.

15. The USB device of claim 11, wherein the training sequence is transmitted while the second transmitter is in a training state.

16. The USB device of claim 11, wherein a first block in sequence of the plurality of second RS-FEC block is the DESKEW block.

17. The USB device of claim 11, wherein the second transmitter starts transmitting the training sequence when the second transmitter wakes up from idling.

18. The USB device of claim 11, wherein the training sequence synchronizes the second transmitter with a receiver of another USB device.

19. The USB device of claim 11, wherein the first transmitter and the second transmitter each comprise:
- an OS generator configured to generate the plurality of first RS-FEC blocks and the plurality of second RS-FEC blocks; and
- a TS generator configured to generate the training sequence.

20. The USB device of claim 11, wherein the first transmitter and the second transmitter are directed by the LASM to change states.

* * * * *